United States Patent [19]

Garrett et al.

[11] Patent Number: 4,989,160
[45] Date of Patent: Jan. 29, 1991

[54] APPARATUS AND METHOD FOR CONTROLLING FUNCTIONS OF AUTOMATED GAS CABINETS

[75] Inventors: Charles W. Garrett, Somerville, Ala.; William H. Robinson, Jr., Huntland, Tenn.; Dennis A. Sierk, Huntsville, Ala.

[73] Assignee: SCI Systems, Inc., Huntsville, Ala.

[21] Appl. No.: 194,828

[22] Filed: May 17, 1988

[51] Int. Cl.[5] .................. C23C 13/02; G06F 15/20
[52] U.S. Cl. .................................... 364/509; 364/141; 364/143; 204/192.1; 222/3
[58] Field of Search ............... 364/509, 558, 141, 143, 364/569, 469; 118/696, 699, 724; 98/32; 204/192.1, 192.13, 192.35, 298.03, 298.25; 137/240; 222/3

[56] References Cited

U.S. PATENT DOCUMENTS

| | | |
|---|---|---|
| 4,256,052 | 3/1981 | Johnson et al. .................. 118/724 |
| 4,500,408 | 2/1985 | Boys et al. ..................... 204/298.03 |
| 4,625,627 | 12/1986 | Livanos et al. ..................... 98/32 |
| 4,700,315 | 10/1987 | Blackburn et al. ............. 204/298.03 |
| 4,736,304 | 4/1988 | Doehler ............................. 364/469 |
| 4,874,723 | 10/1989 | Jucha et al. ..................... 204/192.1 |
| 4,875,989 | 10/1989 | Davis et al. ..................... 204/192.1 |
| 4,891,488 | 1/1990 | Davis et al. ..................... 204/298.25 |
| 4,917,136 | 4/1990 | Ohmi et al. ......................... 137/240 |

Primary Examiner—Thomas G. Black
Assistant Examiner—Ellis B. Ramirez
Attorney, Agent, or Firm—Curtis, Morris & Safford

[57] ABSTRACT

Means are provided for adjustably setting and determining the time duration of flow of a purge gas through process gas supply conduits which supply process gases to semiconductor manufacturing operations. These features are used advantageously to facilitate the changing of certain components of the system, such as a tank of toxic process gas, and/or a filter. A plurality of gas storage and distribution cabinets can be controlled from a single remote personal computer. Alternatively, each individual unit can be controlled by means of its own control system. Setpoints defining, for example, time intervals and pressures to be used in controlling the functions of the gas cabinets may be selected and entered through a front panel on the gas cabinet, or through the remote terminal. A print-out of the selected setpoints is provided by the terminal for improved record keeping of safety procedures used. The invention increases the safety of operation of the gas distribution system, and particularly the safety of the component changing procedures, and reduces the time and cost of such procedures, while improving the records kept regarding safety and other operations of the system.

33 Claims, 7 Drawing Sheets

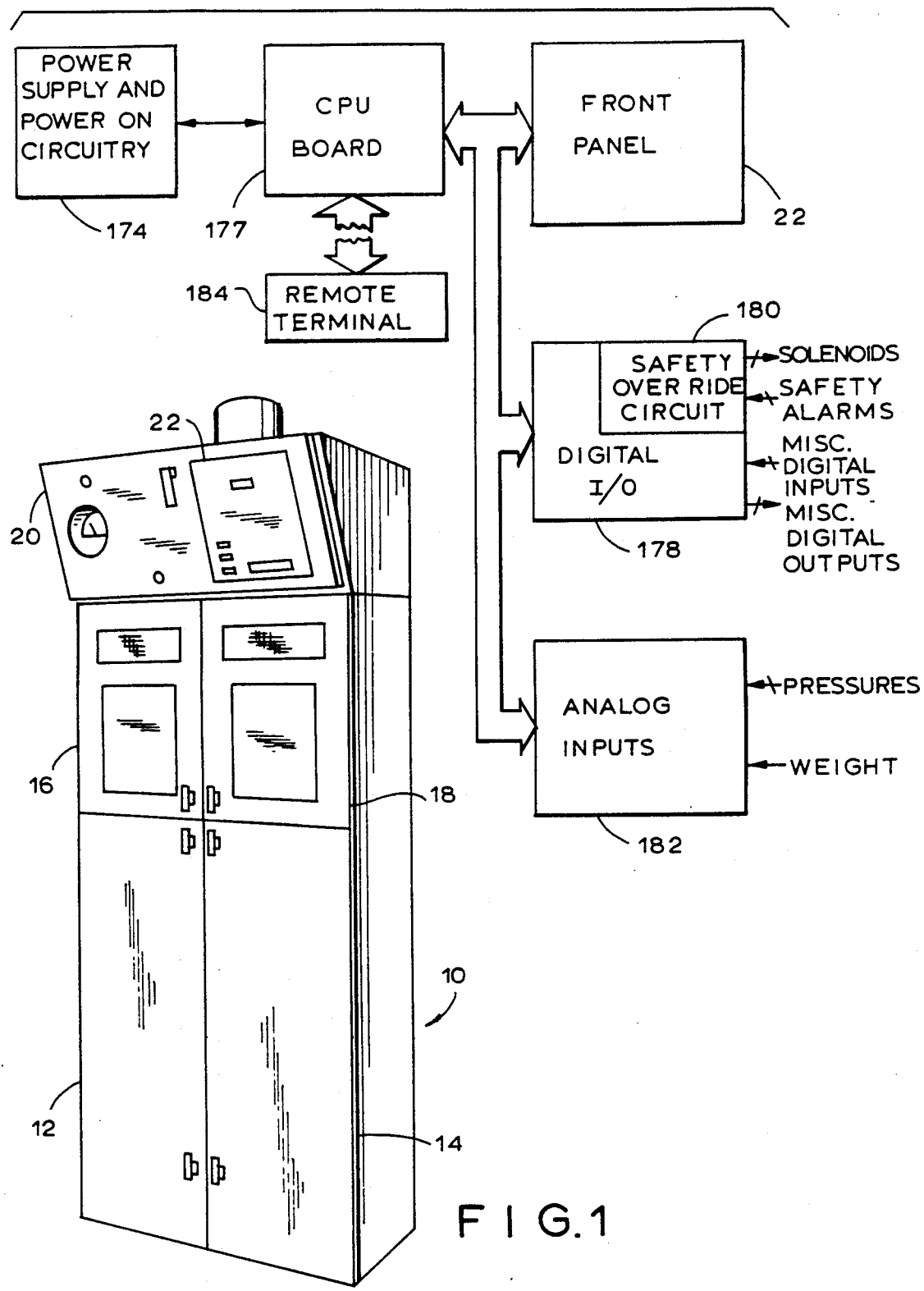

APPARATUS AND METHOD FOR CONTROLLING FUNCTIONS OF AUTOMATED GAS CABINETS

FIELD OF THE INVENTION

The present invention is directed generally to an automated gas cabinet adapted to supply process gas to a tool location and more specifically is directed to methods for controlling functions of such an automated gas cabinet.

BACKGROUND OF THE INVENTION

In the semiconductor manufacturing industry, gas cabinets are used to supply high purity process gases used in production. An example of such a process gas is silane, which is used at the processing location, also known as the tool location, in processes such as sputtering and sputter etching. Silane, like many process gases, is highly toxic and it is of the utmost importance for the safety and health of the workers that the flow of these toxic gases be tightly and safely controlled. The equipment and methods of controlling the functions of the gas cabinets supplying the process gas are therefore of great significance in this industry.

There are several problems with prior gas supply systems. In prior systems, the changing of a supply of toxic gas is accomplished with the use of semi-automatic means to purge the toxic process gas from the gas feed lines. Toxic gas first is removed from the feed line leading from the tank, and then a purging gas such as nitrogen is fed into the feed line to dilute the toxic gas in the feed line. This cycle is repeated a number of times by the operator. Then, the original tank is disconnected from the feed line, and a new tank is connected in its place. Next, the purge gas is removed from the feed line and replaced with the process gas from the new tank in a procedure similar to that of the first purge.

The number of times each purge cycle is repeated is fixed, as if the time duration of each cycle. The problem is that different types of process gas require different numbers and times of purge cycles, as well as different pressures. Because the cycle durations and numbers of cycles which are right for one gas, may be dangerous when used for another, and because equipment can be damaged due to incorrect settings, the inflexibility of prior equipment has detracted from its safety and cost-effectiveness.

Another problem with such prior equipment and methods is that if the cycle times and/or the number of purge cycles is larger than necessary, the process of changing the supply tank is more time-consuming and expensive than it need be.

Another problem is that the gas supply system usually has one or more gas filters which become contaminated and must be replaced from time to time. In prior systems, in order to purge the gas lines, purge gas is sent through the entire gas distribution system to the tool location. Then the filter is replaced, and the entire line is re-filled with process gas. This uses relatively large amounts of expensive, purified purge gas and process gas, and is very time-consuming. The use of bypass lines to reduce the conduit length has been suggested, but not how to use the same.

Another problem with such prior gas supply systems is that it is a time-consuming and inefficient process to establish set points for alarms and safety devices. Setpoints are e.g., the gas pressures at which alarms are activated due to pressures which are too low or too high. In an installation including many different gas cabinets, with past equipment it has been necessary to change the setpoint of each cabinet manually—a time-consuming, expensive procedure.

In some prior systems, a separate control panel for each cabinet is located in a single control room remote from the gas cabinets controlled from the room. This requires a great deal of costly hardware and building construction, as well as still being relatively slow to use in establishing setpoints.

A further problem with prior equipment and methods is that a substantial portion of the record-keeping is manual, tedious and costly. Moreover, it is not reliable and may not be adequate to show that the various cycling procedures and setpoints were maintained safely, in accordance with OSHA standards, in case of an accident.

SUMMARY AND OBJECTS OF THE INVENTION

Therefore, it is an object of the present invention to provide apparatus and methods for controlling functions of a gas cabinet which provide safe containment and accurate control of high-purity process gases.

It is another object of the present invention to provide methods and apparatus for controlling the functions of an automated gas cabinet.

It is another object of the present invention to provide a method for controlling functions of an automated gas cabinet adapted to supply process gas through a manifold to a tool location so as to provide an effective purge operation of the manifold to clear the same of process gas.

It is yet another object of the present invention to provide a method and apparatus for controlling function of such an automated gas cabinet in which the purging operation may be controlled to provide a desired degree of security that all the process gas has been properly cleared from the manifold.

It is a further object of the present invention to provide a method and apparatus for controlling such a gas cabinet to provide an effective purge operation when changing a supply of process gas.

It is still a further object of the present invention to provide an apparatus and method for controlling functions of such an automated gas cabinet in which the setpoints of a control system may be selected and stored for future use in automatic control.

It is yet a further object of the present invention to provide such a method and apparatus in which a printout of the stored setpoints may be provided at a remote terminal location.

It is still a further object of the present invention to provide an automatic purge method and apparatus so as to enable one to change a filter connected in the manifold with minimal risk of contamination.

In accordance with the present invention, there is provided a device and method which eliminates or greatly alleviates the foregoing problems.

By providing a purge device and method in which the cycle times and/or number of purge cycles can be varied easily for each gas cabinet in the system, safety is improved significantly, and purge time and operating costs are minimized.

By using the above, the filter-changing problems noted above have been alleviated or eliminated. The purge is faster, uses less purge gas and process gas, and produces a better purge and is, therefore, safer.

Remote control of one or a plurality of gas cabinets from a single terminal is provided. Setpoints can be set simply, quickly and at a safe distance from the gas cabinets. Purge cycles can be initiated from the single terminal.

Printouts of setpoints and other parameter settings are provided so as to keep good records. This helps in maintaining vigilance and safety, and helps provide good records showing satisfaction of OSHA standards.

In accordance with an aspect of the present invention, a method and apparatus are provided for controlling functions of an automated gas cabinet adapted to supply process gas under pressure through a high pressure area of a manifold to a tool location, the high pressure being normally isolated from remaining areas of the manifold. The method comprises a purge operation which itself comprises the steps of initially storing data representing a selected number of purge cycles in a central system and actuating the control system to automatically perform the selected number of purge cycles, each purge cycle including the steps of activating venturi means connected to a first point of the manifold outside of the high pressure area for creating a vacuum on all points of the manifold in fluid communication with the venturi means, temporarily opening a vent valve to place the high pressure area of the manifold in fluid communication with the venturi means, aborting the purge operation if the pressure within the high pressure area remains above a maximum vacuum pressure, following closure of the vent valve, temporarily opening a purge valve connected between a supply of purge gas and the high pressure area of the manifold for filling the high pressure area with purge gas, and aborting the purge procedure if pressure within the high pressure area remains below a minimum purge pressure.

In a variant of this aspect of the present invention, data representing time intervals for controlling the opening and closing of the respective valves may be initially stored in the control system.

In a further development of this method, the method may include a purge-to-change supply operation comprising the steps of actuating the control system to automatically perform a first one of the purge operation having a first selected number of purge cycles, replacing the supply of purge gas with a new supply of purge gas, actuating the control system to automatically perform a second one of the purge operations including a second selected number of purge cycles and filling the high pressure area of the manifold with the process gas.

Furthermore, apparatus for controlling functions of such an automated gas cabinet comprises control circuit means to a purge actuation signal or automatically generating a plurality of time sequentially ordered purge control systems to control the sequencing of at least a purge operation including at least one purge cycle of the apparatus, input means for initially selecting a number of purge cycles, memory means for storing the selected number of purge cycles and a plurality of valve means on the manifold for performing the purge operation including the selected number of purge cycles.

In another aspect of the present invention, a method for controlling functions of an automated gas cabinet adapted to supply process gas through a manifold to a tool location comprises the steps of initially storing a plurality of selected setpoints in a control system of the gas cabinet, the setpoints respectively indicative of the selected one of a time interval and a pressure and being adapted for control of a respective function during operation of the gas cabinet and controlling the functions in response to the respective stored setpoints. In accordance with this aspect, apparatus for controlling functions of such an automated gas cabinet comprises input means for selected a plurality of such setpoints, memory means for storing selected setpoints and control circuit means responsive to the stored setpoints for controlling the functions of the gas cabinet.

In a further development of this apparatus, the control circuit means controls the operation of a plurality of valve means connected to respective points of the manifold for placing the respective points in fluid communication with other selected points of the manifold, the control circuit means controlling the opening and the closing of respective ones of the valve means in response to respective setpoints indicative of respective time intervals and in response to respective setpoints indicative of respective pressures.

In a further aspect of the present invention, an automatic purge-to-change filter method for an automated gas cabinet adapted to supply process gas successively through a high pressure area and a regulated area of a manifold to a tool location, the regulated area having replaceable filter means for filtering the process gas removably connected thereto, comprises the steps of actuating a control system of the gas cabinet to perform the following steps automatically: activating venturi means connected to a first point of the manifold outside of the high pressure area and the regulated area for creating a vacuum on all points of the manifold in fluid communication with the first point, performing a first purge operation of the high pressure area including at least one first purge cycle by placing the high pressure area in fluid communication with the first point, performing a first purge operation of the regulated area including at least one second purge cycle by placing the regulated area in fluid communication with the first point, detecting the replacement of a previously connected filter means with a newly connected filter means, performing a second purge operation of the regulated area including at least one second purge cycle by placing the regulated area in fluid communication with the first point, performing a second purge operation of the high pressure area including at least one first purge cycle by placing the high pressure area in fluid communication with the first point, and deactivating the venturi means.

In accordance with this aspect of the present invention, the method includes the step of providing a printout of the stored setpoints at a remote terminal location.

These and other objects, aspects and features of the present invention will be made clear from the following detailed description of a preferred embodiment thereof taken in connection with the accompanying drawings, throughout which like reference numerals denote like elements and parts.

BRIEF DESCRIPTION OF THE DRAWINGS

FIG. 1 is a perspective view of an automated gas cabinet whose functions may be controlled in accordance with the present invention;

FIG. 6 is a block diagram of the control circuitry of the gas cabinet of FIG. 1;

GENERAL DESCRIPTION

Figure 2:
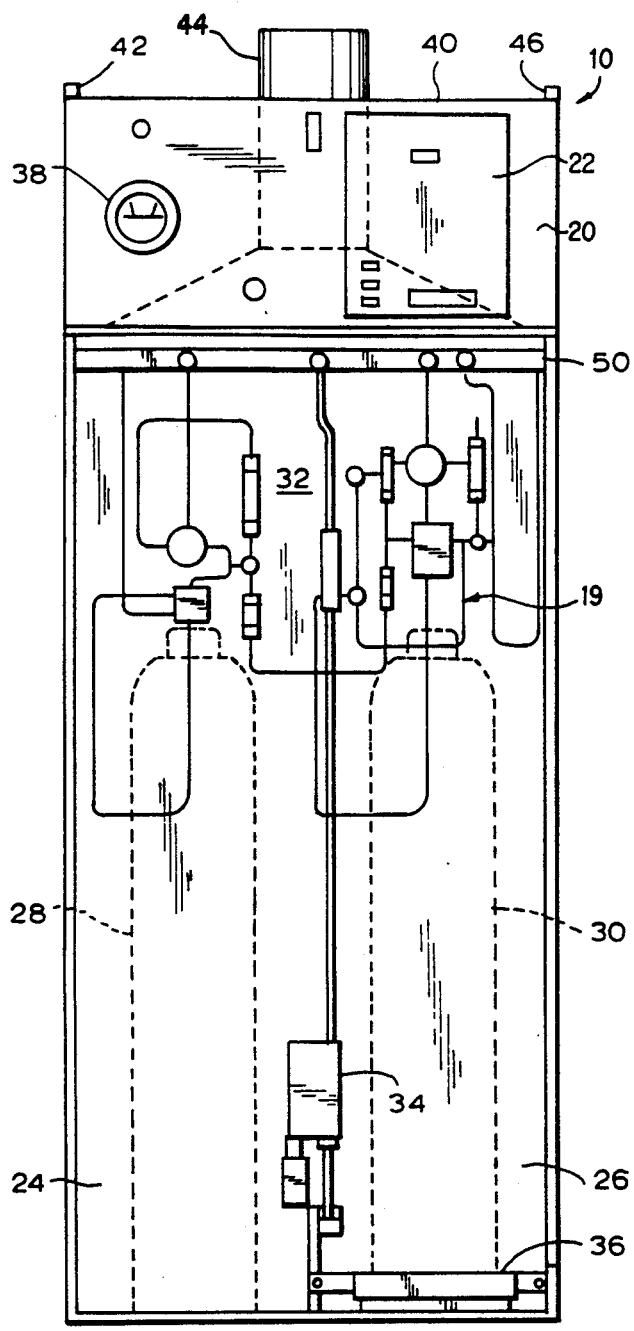
FIG. 2 is a front elevation view of the cabinet of FIG. 1 with its front outer surface removed.
Figure 3:
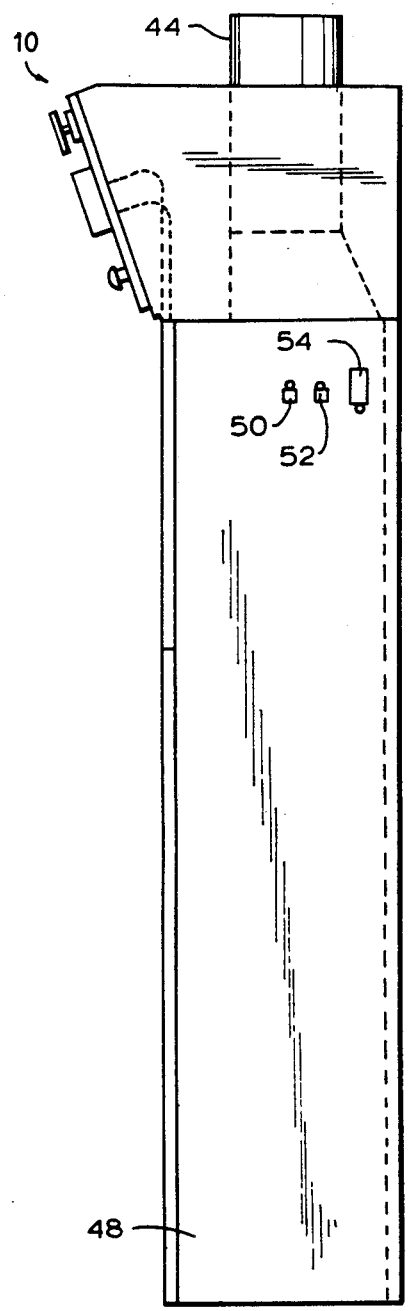
FIG. 3 is a side elevation view of the cabinet of FIG. 1.

Turning now to the drawings and initially to FIGS. 1–3 thereof, an automated gas cabinet 10 whose functions are controllable in accordance with the methods of the present invention is adapted to provide semiconductor manufacturers with safe containment and accurate control of high purity toxic gases used in the production process. Gas cabinet 10 may operate either as a stand-alone cabinet, or may be incorporated in a larger integrated system. It contains within its structure all the equipment necessary to automatically contain and control high purity purge and toxic gases.

Gas cabinet 10 comes in a substantially box-like housing including first and second lower doors 12, 14 leading to a lower compartment 15, first and second upper doors 16, 18 leading to an upper compartment 19, and an upper display surface 20 on which a number of control functions and indications are displayed. In particular, display surface 20 includes an advantageously designed front panel 22 which advantageously displays information about the structure and operation of gas cabinet 10 to indicate the current operational state thereof and the operating conditions during each step of the various processes controlled by gas cabinet 10. Front panel 22 will be described in greater detail below.

As shown in FIG. 2, lower doors 12, 14 each open to reveal a respective gas cylinder storage area 24, 26 within lower compartment 15. Storage area 24 is adapted to receive and store therein a cylinder 28 of purge gas. As defined in this application, the purge gas is an inert gas, advantageously nitrogen $N_2$, which is non-toxic and nonreactive. Storage area 26 similarly is adapted to store a cylinder 30 of process gas, for example silane. Both cylinders 28, 30 are adapted to be connected at different points to a gas manifold 32, held within upper 19 compartment of gas cabinet 10 behind upper doors 16, 18. Manifold 32 includes a number of valves whose operation constitutes an advantageous aspect of the present invention, as described in greater detail below.

The process gas from process gas cylinder 30 is controllably supplied through manifold 32 to a tool location (not illustrated). As the term is used in the semiconductor industry generally, and in the present application, the "tool location" is a processing location where various production processes may be performed during the creation of the desired semiconductor product. These processes at the tool location may include, for example, growing processes such as epitaxial growth processes and chemical vapor deposition processes, sputtering, etching, masking and other processes well known in the art. Each of these processes may require the supply of a process gas to a particular tool location, and different processes may require different process gases.

Process gas cylinder 30, containing a first process gas, is therefore adapted to be disconnected from manifold 32 and removed from gas cabinet 10, at which point another gas cylinder containing a second process gas may be inserted in gas cabinet 10 and connected to manifold 32. During such a change of process gas supply, the process gas held within manifold 32 must be safely contained to prevent its leakage into the atmosphere where it may cause significant health problems. The present invention includes, among other methods, a highly advantageous purge-to-change-supply method whereby manifold 32 is purged of process gas so that the process gas cylinder 30 may be replaced safely.

Manifold 32 includes, in addition the various valves, a number of sensors and filters. The filters used may be particularly adapted to filter one type of process gas or may be usable for all process gases. In either case, the filters will eventually become contaminated. In order to replace the filters, their portion of manifold 32 will be opened, possibly to the atmosphere. The present invention further includes an advantageous purge-to-change-filter method for purging manifold 32 of a process gas to permit the safe replacement of a filter.

Referring again to FIG. 2, storage area 26 containing process gas cylinder 30 advantageously includes a gas sensor 34 for detecting gas leakage and a scale 36 on which process gas cylinder 30 rests. Scale 36 provides a measurement by weight of the amount of gas remaining in process gas cylinder 30 and therefore may be used to indicate when a replacement of the cylinder 30 is necessary.

Display surface 20 (FIGS. 1 and 2) may include other sensors and indicators in addition to front panel 22 and, in the preferred embodiment, includes a photohelic exhaust sensor 38. The top surface 40 of gas cabinet 10 includes a number of vents, including photohelic vents 42 and exhaust vents 44, as shown in FIGS. 2 and 3. Extending from the top surface 40 is a connector 46 to which a house supply of nitrogen $N_2$ gas may be connected to supplement or substitute for the nitrogen gas in purge gas cylinder 28. The house nitrogen pressure will be 80 psi or greater to activate the valves of manifold 32 in the manner described below.

Located on the right side surface 48 of gas cabinet 10, as illustrated in FIG. 3, is a process gas output connector 50 and a second house nitrogen input connector 52. Process gas output connector 50 is adapted to be connected to a tube leading physically from gas cabinet 10 to the tool location. A water connection 54 is also provided.

CONTROL PANEL

Figure 5:
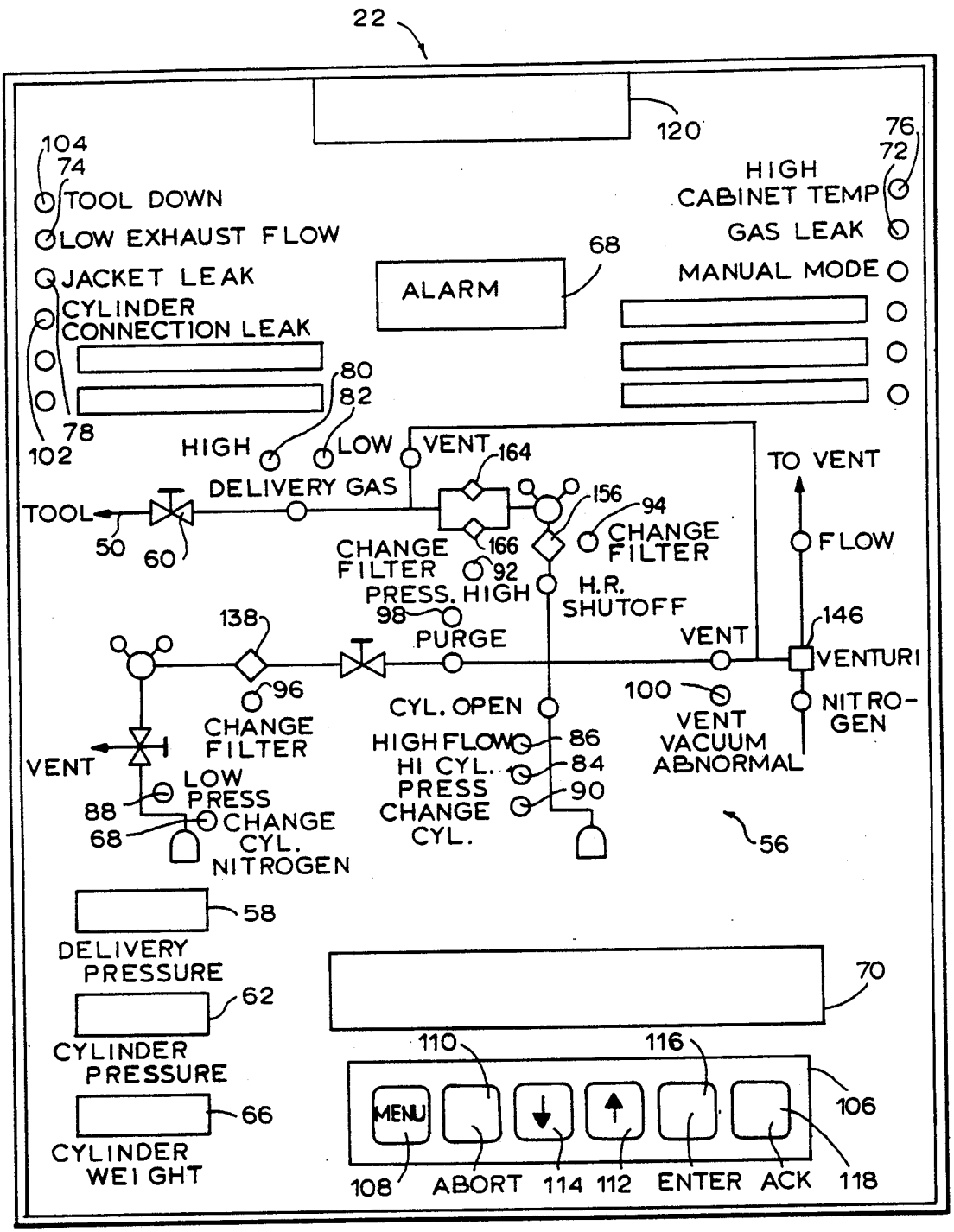
FIG. 5 is an elevation view of a front panel of the gas cabinet of FIG. 1.

Front panel 22 on display surface 20 is illustrated in detail in FIG. 5. Front panel 22 is a 12 inch by 15 inch graphic display panel and includes a manifold graphic 56 providing a schematic display of manifold 32.

Graphic display 56 schematically illustrates the purge gas cylinder 28, process gas cylinder 30, a plurality of valves, regulators and a venturi, all of which will be described in greater detail below in connection with FIG. 4. The valves are illustrated in their proper locations within manifold 32 and are advantageously provided with indicators, such as green LED indicators. When these indicators are lit, they indicate that the respective valve is open.

In the lower left hand corner of front panel 22 are three processing conditions. Delivery pressure indicator 58 provides a readout of the pressure present upstream of a delivery valve 60 positioned just before output 50 leading to the tool location. Cylinder pressure indicator 62 provides a readout of the pressure present downstream of a cylinder valve 140 controlling process gas cylinder 30. Cylinder weight indicator 66 provides a readout of the cylinder weight of process gas cylinder 30 as indicated by the scale 36 shown in FIG. 2. Advantageously the pressure readings are in p.s.i. and the weight is in pounds.

Front panel 22 also provides a large number of alarm and status indicators. The alarms and status indications that refer to a particular aspect or position of the manifold 32 and its operation are shown near that location on display 56. Other, more general cabinet status indicators are LEDs which, when on, indicate that the associated alarm or status indication is active, indicators associated with alarms being red and general indications being yellow.

In the upper central portion of panel 22 is a large LED alarm indicator 68. Alarm indicator 68 flashes to indicate that a significant alarm has not been acknowledged by the operator and it remains on until all significant alarms have been cleared. An alphanumeric display 70 is provided for displaying alarm messages. It is a two line by twenty character LCD display and is used to provide information and to prompt the input of commands and data in the text format.

All the indicators will flash on and off when the respective alarms are activated, will shine continuously after an operator has acknowledged the alarm, and will turn off after deactivation. Advantageously, a horn or other audible alarm may additionally be provided to indicate alarm conditions.

In accordance with an advantageous aspect of the present invention, certain high priority alarm conditions are handled by two different controls for redundancy. The first, a microprocessor-based control is handled by a central CPU board, which is shown in FIG. 6 and is described below. This control is programmable and will be referred to herein as CPU control.

The second control is fail-safe and includes a hardwired circuit integral to the electronics which monitors the microprocessor If the microprocessor ever fails to execute its program loop, the monitoring circuitry will automatically restart the microprocessor, advantageously within 200 milliseconds. Additionally, the hardwired circuit includes independent valve shutdown circuitry for controlling potentially life-threatening conditions. This circuitry is independent of the microprocessor and will override any other command if conditions such as gas leak, low exhaust flow or high temperature are detected. This control will be referred to herein as "hardwire" control.

The individual indicators on front panel 22 will now be described using the following terms:
Activation (condition that causes alarm to occur);
Activation Delay (debounce time used to insure alarm is valid);
Alarm Outputs;
Alarm Deactivation (requirements to clear alarm);
Deactivation Delay (debounce time to insure alarm cleared);
Alarm Message (message displayed in the alphanumeric display 70; and
Valve Operation (valves that are closed based on alarm).
Alarm indicator 68 will flash and operate continuously with the individual indicators unless otherwise stated.

Referring to the upper right-hand portion of FIG. 5, a gas leak alarm indicator 72 is a high priority alarm and is responsive to gas sensor 34 (FIG. 2) in gas cabinet 10. As a high priority safety alarm, it is handled both by CPU and hardwire control. CPU control is activated upon receipt of a signal from gas detector 34, with an activation delay of three seconds. The alarm deactivation occurs when the gas leak condition clears and the alarm is acknowledged, with a deactivation delay of five seconds. The alarm message reads "Gas leak", and all valves are closed. Hardwire control is responsive to this alarm to close the cylinder and high pressure shutoff valve 152 (see discussion of FIG. 4).

As shown in the upper left-hand portion of FIG. 5, low (or high) exhaust flow indicator 74 indicates improper exhaust flow levels. CPU control is activated upon contact from photohelic sensor 38 with an activation delay of ten seconds. The alarm is deactivated upon the low or high exhaust condition being cleared and the alarm acknowledged with a deactivation delay of five seconds. The alarm message is "Low exhaust flow" and all valves are closed. Hardwire control closes all valves. An adjustable 0–10 second timer can be set to debounce the alarm signal.

High cabinet temperature indicator 76 is a high priority alarm for which CPU control is activated upon contact with a thermostat (not illustrated) with an activation delay of ten seconds. The alarm is deactivated when the high temperature condition clears and the alarm is acknowledged with a deactivation delay of five seconds. The alarm message is "High Temperature" and all valves are closed. Hardwire control is responsive to close the cylinder and the high pressure shutoff valves.

Jacket leak indicator 78 is useful when a jacketed line from process gas outlet 50 on gas cabinet 10 to the point of delivery at the tool location is monitored. Under these conditions, gas cabinet 10 accepts an input from a user-supplied jacket pressure switch, including a jacket leak detector. The jacket leak alarm is a high priority alarm. CPU control includes activation by the jacket pressure switch with an activation delay of twenty seconds. The alarm is deactivated when the jacket leak condition clears and the alarm is acknowledged with a deactivation delay of five seconds, and the alarm message is "Jacket leak". Both the CPU and hardwire valve operation close the cylinder and high pressure shutoff valves.

High pressure delivery indicator 80 detects excess delivery pressure and is a high priority alarm. CPU control includes activation by an analog pressure measurement in excess of a setpoint level, with an activation delay of fifteen seconds. The alarm is deactivated upon delivery pressure drop below the setpoint and an alarm acknowledgement, with a deactivation delay of five seconds and an alarm message of "High deliv press".

The CPU valve operation closes all valves. Hardwire control also detects this alarm, with an input from a pressure switch rather than the analog reading used for CPU control. Hardwire control closes the cylinder and high pressure shutoff valve 152.

Low delivery pressure indicator 82 is a status indication which becomes active if the delivery pressure, measured when the cylinder and high pressure shutoff valve 152 is open and a bypass vent 176 is closed, drops below a setpoint, with an activation delay of fifteen seconds. The alarm is deactivated when the delivery pressure rises above the setpoint and the alarm is acknowledged with a deactivation delay of five seconds. The alarm message is "Low deliv press" and there is no valve operation.

High cylinder pressure indicator 84 becomes active if the cylinder pressure is above a setpoint value when the cylinder valve is open, with an activation delay of three seconds. The alarm is deactivated when the cylinder pressure drops below the setpoint with an alarm acknowledgement and a deactivation delay of five seconds. The alarm message is "High cyl. pressure" and all valves are closed.

High flow alarm indicator 86 is advantageously available when gas cabinet 10 includes a cylinder flow switch operation. It is activated by the high flow switch when the cylinder valve is open with an activation delay of fifteen seconds. It is deactivated when the high flow switch clears and the alarm is acknowledgement with the deactivation delay of five seconds. The alarm message is "High Gas Flow" and all valves are closed.

Low $N_2$ pressure alarm indicator 88 is a status indication which is active if the purge nitrogen pressure drops below a pressure switch setting with an activation delay of ten seconds. The alarm is deactivated when the $N_2$ pressure rises above the switch setting and the alarm is acknowledged with a deactivation delay of five seconds. The alarm message is "Low $N_2$ press" and no valves are closed.

Cylinder empty alarm indicator 90 is a status indication that the process gas cylinder 28 is empty. Gas cabinet 10 equipped with scale 36 bases this detection on weight. When gas cabinet 10 does not include scale 36, the detection is based on cylinder pressure, when an analog pressure measurement is below a "cylinder empty" pressure setting and the cylinder valve is open. The activation delay is sixty seconds. The alarm is deactivated when either the weight is measured above the cylinder empty weight setpoint or the analog pressure measurement is above the cylinder empty pressure setting when the cylinder valve is open. The alarm must also be acknowledged for deactivation. There is a deactivation delay of five seconds with an alarm message "Out of Gas" and there is no valve operation.

Dirty pre-filter alarm indicator 92 detects the possibility of a dirty filter 156 (FIG. 4) on the input side of a regulator 158. It does so by measuring the differential between cylinder pressure, and indicates when that differential and pre-regulator pressure is greater than a dirty pre-filter setpoint. The measurement is made only when purging gas or delivering gas to the tool. The activation delay is ninety seconds, and the alarm is deactivated when the differential drops below the setpoint and the alarm is acknowledged with a deactivation delay of five seconds. The alarm message is "Check Pre-Filter" and there is no valve operation.

Dirty final filter alarm indicator 94 detects the possibility of a dirty final filter 164, 166 on the output side of regulator 158. It is activated when the differential between the pre and post filter delivery pressures is in excess of a dirty final filter setpoint. The measurement of the differential is made only when delivering to the tool or purging with an activation delay of ninety seconds. The alarm is deactivated when the differential drops below the setpoint and the alarm is acknowledged with a deactivation delay of five seconds. The alarm message is "Check Final Filter" and there is no valve operation.

Dirty $N_2$ filter alarm indicator 96 detects the possibility of a dirty purge $N_2$ filter 138 by measuring the differential between the regulated $N_2$ pressure and the cylinder pressure, and indicates when that differential is in excess of a dirty $N_2$ filter setpoint. The check is made only when the purge valve is open. The activation delay is thirty seconds. The alarm is deactivated when the differential drops below the setpoint and the alarm is acknowledged, with a five second deactivation delay. The alarm message is "Check $N_2$ Filter" and there is no valve operation.

High pressure purge alarm indicator 98 is a status indication which becomes active if the regulated $N_2$ purge pressure rises above the alarm setpoint when the purge valve 126 is open, with an activation delay of 10 seconds. The alarm is deactivated when the regulated $N_2$ pressure drops below the setpoint and the alarm is acknowledged with a five second deactivation delay. The alarm message is "High $N_2$ pressure" and there is no valve operation.

High vacuum pressure alarm indicator 100 is generated only during a purge cycle, discussed below, when the venturi 146 (FIG. 4) is on and the vent valve 144 is open and if the venturi vent pressure fails to drop below a setpoint. The setpoint is expressed in terms of absolute pressure (p.s.i.a.) and the activation delay is five seconds. The alarm is deactivated when the purge cycle is terminated and the alarm is acknowledged, with a five second deactivation delay. The alarm message is "Hi Press in Manifold" and all valves close and the purge cycle is aborted. This function will be further described below in connection with the purge-to-change-supply method in accordance with the present invention.

Cylinder connection leak indicator 102 is used in the final step of the purge-to-change-supply function described below as a check for a process gas cylinder connection leak. The CPU control performs this check by reading the initial cylinder pressure I at a certain initial time and by counting down for two minutes. If at any point during this two minute period the "final" cylinder pressure F drops by over 5% from the initial value, the CPU control considers this to be cylinder connection leak. If such a leak is detected, an alarm message will be displayed and the cylinder valve will be closed. Otherwise, at the end of the two minute period, the cylinder valve will close and the function is complete. The activation delay is five seconds, and the purge cycle is aborted when the alarm is acknowledged, with a deactivation delay of 5 seconds. The alarm message is "Bottle conn leak" and all valves close to terminate the purge cycle.

"Tool down" indicator 104 is intended to be connected to a user-provided detection indicator at the tool location for indicating a problem at the tool location itself, as opposed to a problem dealing within the gas cabinet 10. Gas cabinet 10 may be programmed to respond to this detection by closing all valves, or may be otherwise programmed in accordance with the user's requirement.

Beyond these indicators, front panel 22 also includes a keypad 106 at its lower edge. Keypad 106 includes a menu pushbutton 108 used to initiate menu selection of available operator initiated functions, and an "abort" pushbutton 110 used to terminate any function that is currently in process. Also included are an "up" arrow pushbutton 112 used to scroll upwards through the menus or, in accordance with an aspect of the present invention, to increase a setpoint value, and a "down" arrow pushbutton 114 used to scroll downwards through the menus or, in accordance with an aspect of the present invention, to decrease a setpoint value. Keyboard 106 further includes an "ENTER" pushbutton 116 used as a selection initiation key and as a setpoint entry key, an acknowledge ("ACK") pushbutton 118 is used to acknowledge an alarm, as noted above.

A further display 120 is provided at the top center of front panel 22 in order to continuously display some data relevant to the operation of the particular gas cabinet, for example, the number of the gas cabinet and the type of process gas being provided thereby.

MANIFOLD

The construction of manifold 32 will now be described in connection with FIG. 4. As indicated therein, manifold 32 is in reality two interconnected manifolds including a regulated area 122 associated with purge gas cylinder 28, a high pressure area 124 associated with process gas cylinder 30, and a regulated area 125 associated with a pressure regulator 158, discussed below. Area 122 is isolated from high pressure area 124 by a purge valve 126, which may be opened to place regulated area 122 in fluid communication with high-pressure area 124.

Area 122 includes a first manual valve 128 connected between purge gas cylinder 28 and a pressure regulator 130 which includes first and second pressure indicating transducers 134 and 136. Valve 128 is also connected to exhaust vent 44. An $N_2$ filter 138 and a second manual valve 139 are connected between pressure regulator 130 and purge valve 126.

The process gas cylinder 30 is connected through a pneumatically controlled cylinder valve 140 and a flow meter 142 at a junction point 127 on the right of purge valve 126. The junction point 127 is isolated by a vent valve 144 from a vacuum venturi 146. Venturi 146 is supplied by the house nitrogen through the house $N_2$ valve 148 and is fed out through a vent 44. Vent valve 144 may be opened to place the high pressure area 124, regulated area 125 and, possibly, $N_2$ regulated area 122 in fluid communication with venturi 146.

Venturi 146 does not operate at all times, but may be activated when desired to create a low pressure condition on all points of manifold 32 which are in fluid communication. A pressure-indicating transducer 150 is provided to sense the venturi or vent pressure.

The conjunction point 127 between purge valve 126, flowmeter 142 and vent valve 144 is further connected to a high-pressure shutoff valve 152 which controls the primary flow path to the tool location. The pressure upstream of high pressure shutoff valve 152 is measured by a pressure indicating transducer 154. The downstream side of valve 152 leads through a filter 156 to a pressure regulator 158. First and second pressure indicating transducers 160, 162 measure the pressure upstream and downstream of pressure regulator 158, respectively. Following regulator 158 is a dual filter system including filters 164 and 166 and a pressure-indicating transducer 168, which measures the delivery or post-filter pressure. A delivery valve 60 and a manual shut-off valve 172 then lead to process gas exit connection 50 from which process gas is supplied to the tool location.

A bypass conduit 174 is provided to permit the purging of regulated area 125 during a filter change operation. Bypass conduit 174 leads from the connection between vent valve 144 and venturi 146 through a bypass vent valve 176 to the connections between transducer 168 (or, in fluid communication terms, high-pressure shut off valve 152) and delivery valve 60.

Valves 172 and 176 may therefore be used to prevent any process gas from escaping into the atmosphere except through venturi 146. The remaining valves are controlled by the CPU/hardwire controls of gas cabinet 10 to open and close at certain times and in response to certain pressures, herein referred to as "setpoints", to achieve the advantageous control functions according to the present invention.

CONTROL CIRCUIT

These control functions are performed by the circuitry illustrated in block diagram form in FIG. 6. This circuitry includes power supply and power-on circuitry 174 which, together with front panel 22, is directly connected to a CPU board 177 which includes the microprocessors, read only memories, random access memories and the other elements conventionally known which may be combined to provide the programmable CPU control of the valves and indicators described above. CPU board 177 outputs to and receives data from a digital I/O circuit 178 which includes a hard wired safety override circuit 180 providing the hardwire control through solenoids as the second level of safety and contamination prevention, together with CPU board 177.

Digital I/O circuit 178 further receives and outputs a variety of miscellaneous digital signals used in the general control of gas cabinet 10. Analog inputs of gas cabinet 10, such as the weight of process gas cylinder 30 from scale 36 and the gas pressures from the various pressure indicating transducers, are supplied through an analog input circuit 182 to CPU board 177 which, in turn, controls the operation of these devices

MULTIPLE-CABINET SYSTEM

In accordance with a further aspect of the present invention, CPU board 177 is in communication with a remote terminal 184, which may be a personal computer or the like. Remote terminal 184 may advantageously be the SCI 4610 Distributed Gas System Controller, provided by the assignee of the present application. This unit, based on an IBM PCAT plus an industrial system control computer, allows centralized monitoring and control of gas cabinet 10. This is particularly advantageous when a number of gas cabinets are integrated within an entire system, in which case the controller controls all the cabinets within the system to provide different process gases at various times to the tool location. Interconnection between this master controller and gas cabinet 10 is achieved through a single cable containing two twisted pairs.

SETPOINT SELECTION

In accordance with an aspect of the present invention, the various functions of gas cabinet 10 are controlled in accordance with setpoints which may be selected by the operator. These setpoints include, for example, a maximum pressure which one of the pressure indicating transducers described above may register before initiating an alarm, a minimum pressure similarly used, a time during which a certain step in a process is to be continued, or an integer indicating the number of times which a step or steps in a process is to be repeated. For example, in some of the methods described below, purge cycles of different types may be repeated for selected numbers of times. The operator selects and enters the number of times that each purge cycle is to be performed. The entry of these setpoints, together with any other manual control, is achieved either at the remote terminal 184 or at the front panel 22. The overall control program available at both locations presents a layered menu to permit the operator to choose which function to select, initiate or modify.

For example, referring again to FIG. 5, in order to select or adjust any setpoint at front panel 22, menu pushbutton 108 is depressed first and then "down" arrow pushbutton 114 is depressed a number of times to scroll through the layered menu selection until the current value of that setpoint appears on alphanumeric display 170. These setpoints, used for alarm and warning indications, include the following: cylinder empty, high delivery pressure, high cylinder pressure, high purge pressure, dirty $N_2$ filter differential, low delivery pressure, dirty pre-filter differential and dirty post-filter differential. When the current value is displayed, depressing enter pushbutton 116 will cause the current value to be stored again, while pressing abort push button 110 will cause the selection process to be aborted in such a way that the current value still stored in memory remains as the set value. Alternatively, the setpoint can be adjusted through the use of up and down arrow pushbuttons 112, 114. Depressing up arrow pushbutton 112 will cause the value to be increased, while depressing down arrow button 114 will cause the value to be decreased. The increases and decreases are achieved in incremental steps which are initially small but are gradually increased the longer the pushbutton 112, or 114 is depressed. Once the desired setpoint value is reached, it can be stored in memory by depressing ENTER pushbutton 116. This stores the setpoints in a non-volatile EEPROM on CPU board 176, where they will be maintained even if gas cabinet 10 should lose power.

Various setpoints for the purge cycle definitions may also be entered and adjusted through the use of keypad 106 or remote terminal 184 (FIG. 6). As discussed below, the number of cycles, such as pre-cycles and post-cycles, for a particular operation may be adjusted, as may the purge and vacuum times, together with the minimum purge pressure to which the manifold 32 must be filled to indicate a proper purge, as well as the maximum vacuum allowed during a vacuum cycle within manifold 32 to indicate that a proper evacuation has occurred. The times are adjustable in seconds. The purge is adjustable in PSIG (above atmospheric pressure). The maximum vacuum pressure is adjustable in PSIA (absolute pressure, where atmospheric pressure is 14.7 PSIA).

CPU 177 (FIG. 6) and safety override circuit 180 thus control the functions of gas cabinet 10 in response to the stored setpoints. This is achieved, for example, in the operations described below and in the control of the various alarm indicators mentioned above when a respective setpoint is violated.

CONTROL PROGRAMS

In accordance with an advantageous aspect of the present invention, CPU board 177 is adapted to control the functions of gas cabinet 10 in accordance with a number of control programs stored in a memory within CPU board 177. These control programs may be run directly out of a random access memory or out of the CPU, or may be stored in a read-only memory, loaded into a random access memory as needed and then run.

Figure 7:
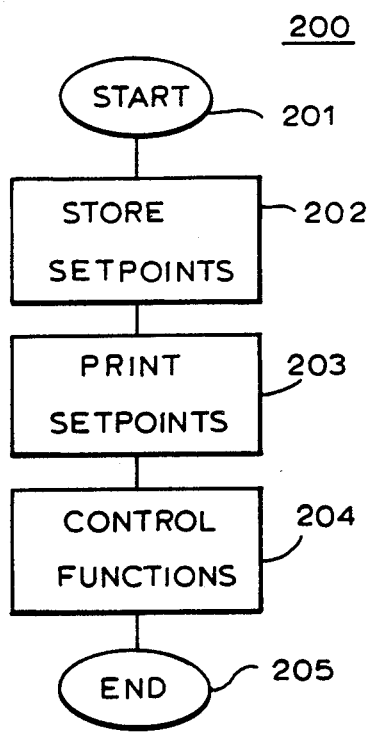
FIG. 7 is a flowchart of a first control program operated by the control circuitry of FIG. 6.

One advantageous method for controlling the functions of the gas cabinet 10 is achieved by control program 200 illustrated in flowchart form in FIG. 7. Control problem 200 is directed to that aspect of the present invention discussed immediately above, in which the setpoints used in the control of gas cabinet 10 are selected, for example, by the operation of front panel 22, stored and then used in the control of the valves, pressure indicating transducers, alarm indicators, etc. available on manifold 32 and elsewhere in gas cabinet 10.

Control problem 200 starts at step 201 when the operator actuates CPU board 177 through front panel 22 or remote terminal 184, and then, at step 202, initially stores a plurality of selected setpoints in a control system, for example, CPU board 177 of gas cabinet 10 These setpoints are, for example, respectively indicative of either a time interval, a number of cycles, or a pressure, and are adapted for control of a respective function, such as valve opening and closing.

At step 203, a printout of the setpoints is provided at remote terminal 184. This is highly advantageous, not merely because it provides the operator with an immediate confirmation of the selected values of the setpoints, but also because it provides a permanent record of the setpoints selected at each time. A permanent record is valuable both for determining a proper mode of operation and as proof that an operation was performed in a safe manner. At step 204, the functions of gas cabinet 10 are controlled in response to the respective stored setpoints and at step 205 control program 200 ends.

Front panel 22 and/or remote terminal 184 are thus operative as input means for selecting the plurality of setpoints, with CPU board 177 including the memory for storing the selected setpoints and the control circuitry responsive to the stored setpoints for controlling the function of gas cabinet 10. During the printout of the setpoints, remote terminal 184 is controlled by the control circuitry of CPU board 177. During step 204, the control circuitry of CPU board 177 controls the opening and closing of the various valves described above in connection with FIG. 5 in response to the respective setpoints, both those indicative of respective time intervals and those indicative of respective pressures.

PROGRAM FOR CHANGING PROCESS GAS SUPPLY

Another aspect of the present invention is directed to an advantageous purge-to-change supply operation, as mentioned above, which advantageously permits the replacement of process gas cylinder 30. This operation is an automatic sequence designed to evacuate manifold 32 of process gas, allow a process gas cylinder replacement, again purge manifold 32, refill manifold 32 with process gas, and check for a cylinder leak. It is important during such an operation to ensure that no contaminating process gas leaks either from cylinder 30 or from manifold 32.

Figure 8:
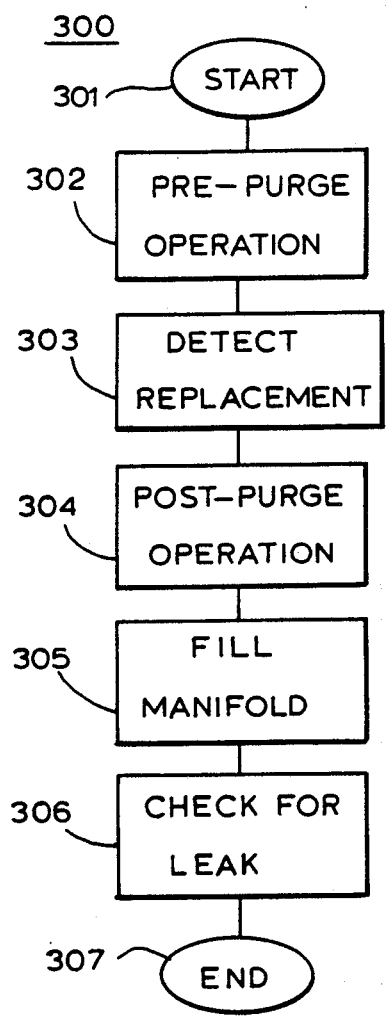
FIG. 8 is a flowchart of a second control program operated by the control circuitry of FIG. 6 during a purge-to-change-supply operation.
Figure 11:
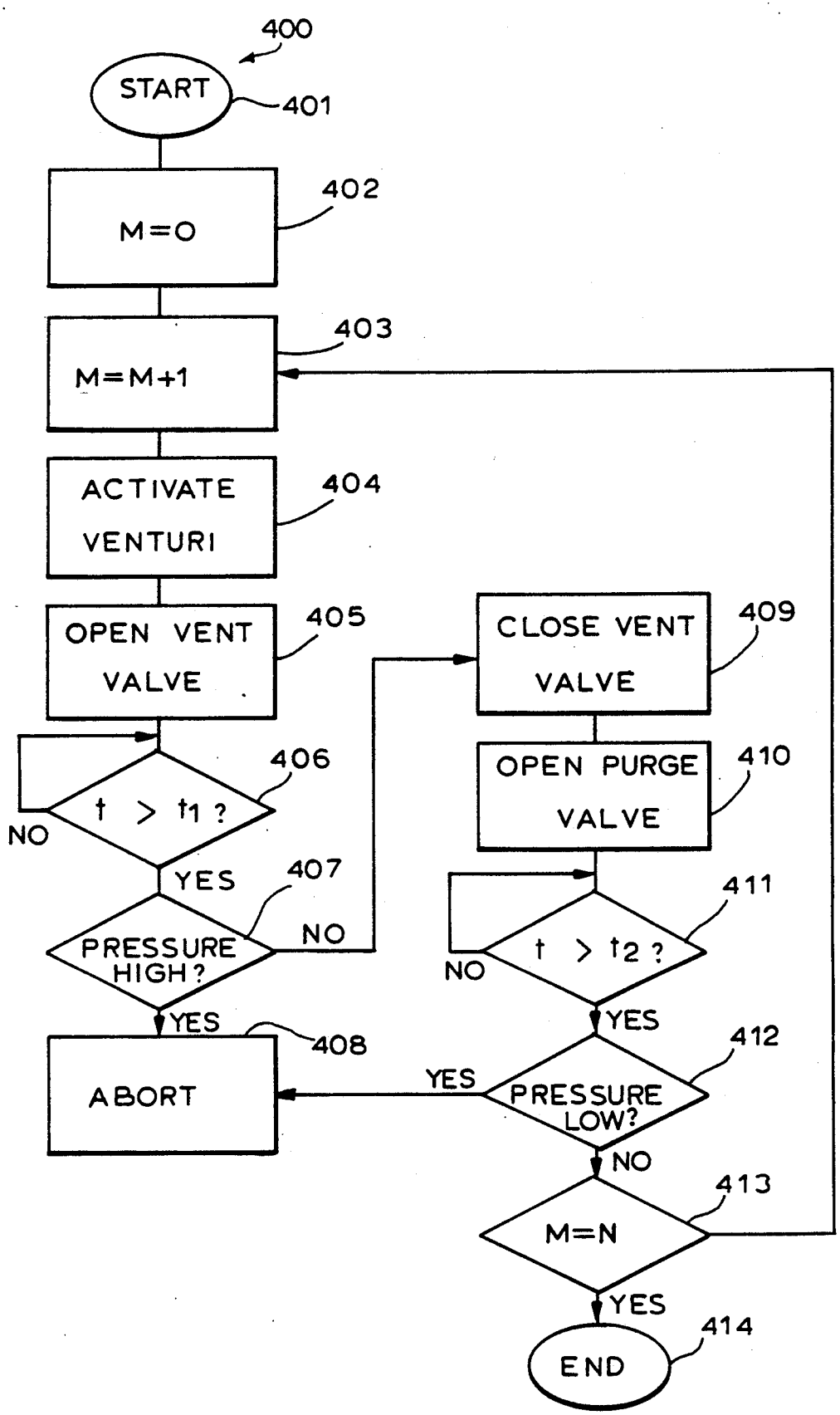
FIG. 11 is the flowchart of a third control program operated by the control circuitry of FIG. 6 during a purge cycle.

Control program 300, illustrated in FIG. 8, defines the overall steps in this operation. Program 300 begins at step 301 in response to a first operator actuation and then at step 302 a first purge, called a "pre-purge" operation is performed. The details of the purge cycles of the pre-purge operation are discussed below in connection with FIG. 11 and constitute a further aspect of the present invention.

After the pre-purge operation is complete, alphanumeric display 70 on front panel 22 will display the message "change cylinder...Push ENTER when done." The operator may then change process gas cylinder 30. Purge valve 126 (FIG. 4) is open so that manifold 32 will not become contaminated. When the operator has finished the replacement, he pushes ENTER pushbutton 116. At step 303, this actuation indicating the replacement of process gas cylinder 30 is detected and at step 304, in response to a second operator actuation, a second purge, called a "post-purge" operation, 32 is performed. At the completion of this second purge operation, manifold 32 is filled with process gas in step 305 and then in step 306 a check is made to detect the possibility of a leak from the connection of the new cylinder 30. Control program 300 then ends at step 307.

Figure 9:
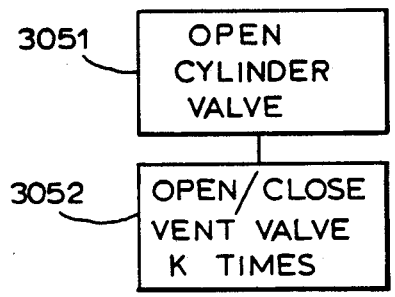
FIG. 9 is a flowchart of a first subroutine of the program of FIG. 8.

As shown in FIG. 9, step 305 to fill the manifold includes at step 3051 opening cylinder valve 140 (FIG. 4) at the top of process gas cylinder 30, and then at step 3052 opening and closing vent valve 144 a selected number (K) times to withdraw process gas from process gas cylinder 30. K is advantageously 3.

Figure 4:
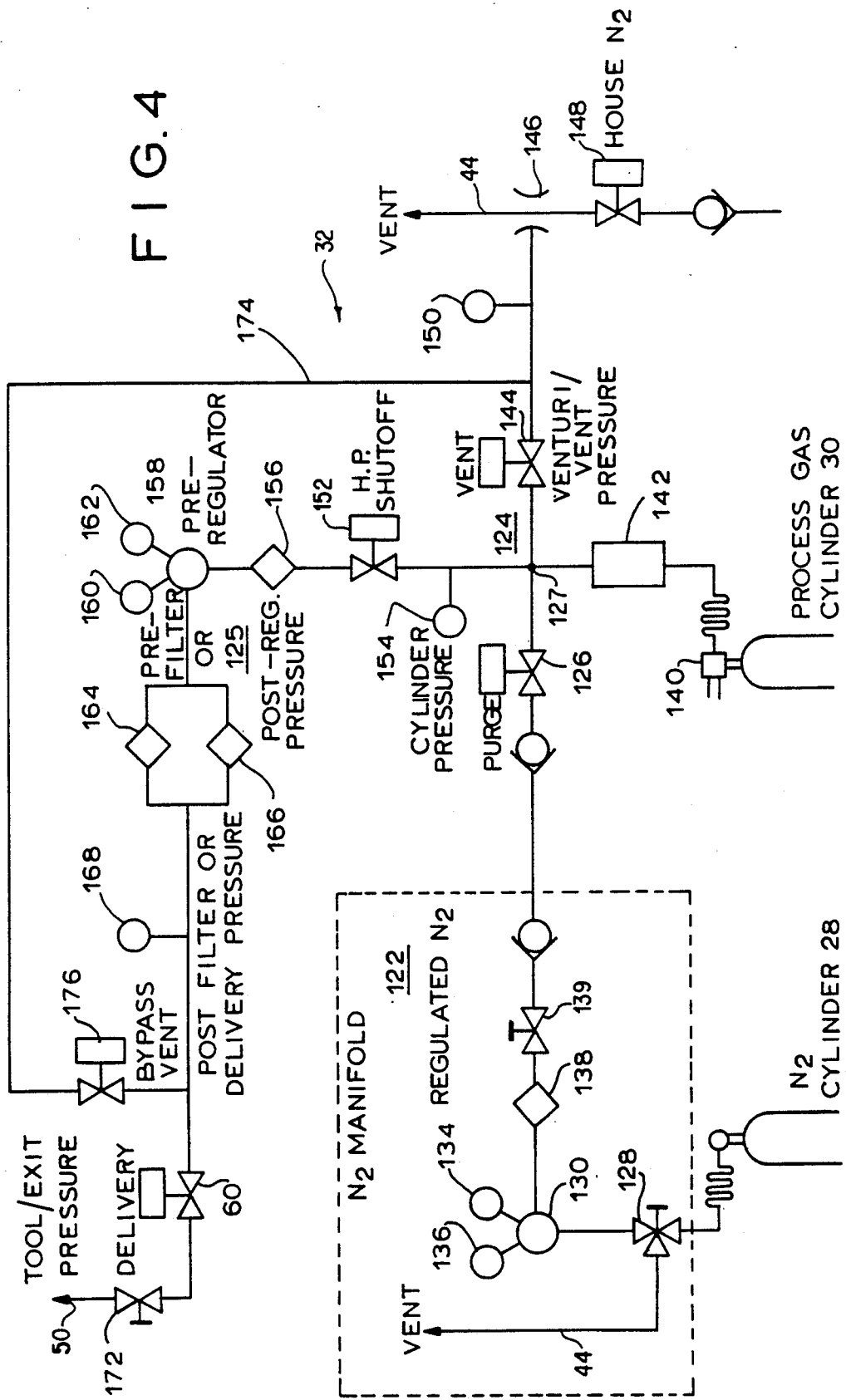
FIG. 4 is a schematic diagram of a gas manifold within the gas cabinet of FIG. 1.
Figure 10:
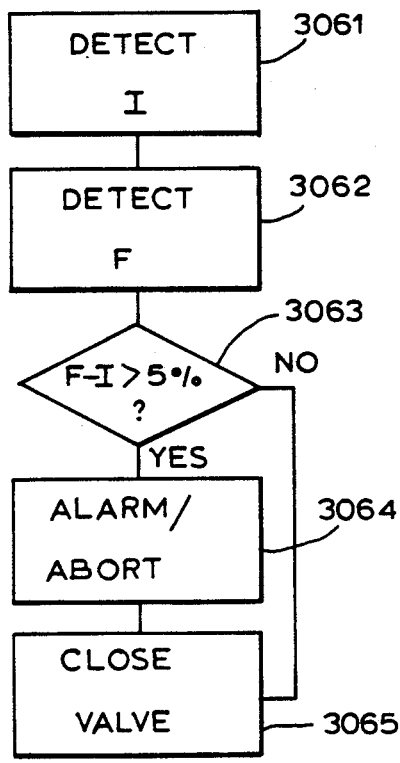
FIG. 10 is a flowchart of a second subroutine of the program of FIG. 8.

As shown in FIG. 10, step 306 in which a leak from process gas cylinder 28 may be detected begins at step 3061 in which an initial pressure I is detected by pressure indicating transducer 154 (FIG. 4). For a predetermined period of time thereafter, steps 3062 and 3063 repeat. At step 3062 a later or final pressure F is detected by pressure indicating transducer 154, and at step 3063 the final pressure F is compared with the initial pressure I. If at any time during the predetermined period of time the final pressure F falls below the initial pressure I by a selected amount, for example 5%, a leak is presumed to be present and the program proceeds to step 3064 in which the purge-to-change-supply operation is aborted. As noted above, this causes all valves to close and the indicator 72 on front panel 22 (FIG. 5) to light up. If, however, the final pressure F remains sufficiently close to the initial pressure I, the program proceeds directly to step 3065 in which cylinder valve 140 is closed.

The operation of gas cabinet 10 during the first and second purge operations noted above is more fully illustrated in FIG. 11, which is a flowchart of a control program 400 used to achieve this advantageous operation. Prior to this function, a number of setpoints are selected and stored. These include at least two time intervals t1, t2, an integral number N of purge cycles, a maximum vacuum pressure and a minimum purge pressure. These setpoints are stored in the memory of CPU board 176.

Control program 400 starts at step 401 and then moves to step 402 in which a number M of completed purge cycles is initialized, and then at step 403 the number of purge cycles is incremented to begin counting. At step 404, venturi 146 (FIG. 4) is activated by opening the house nitrogen valve for creating a vacuum on all points of manifold 32 in fluid communication with venturi 146. At this point, vent valve 144 and by-pass vent valve 176 are closed. In step 405, vent valve 144 is temporarily opened to place the high pressure area of manifold 32 in fluid communication with venturi 146.

Setpoint time t1 is the vacuum time/cycle during which manifold 32 is evacuated through venturi 146. Control program 400 waits at step 406 until vent valve 144 has been open for at least as long as setpoint time t1. After time t1 has elapsed, i.e., when the time t is greater than t1, it is determined in step 407 whether the pressure remains above the setpoint maximum vacuum pressure, as indicated by pressure indicating transducer 150. If the detected pressure remains too high, the purge cycle, together with the entire purge operation, is aborted at step 408 and vent vacuum abnormal indicator 100 on front panel 22 (FIG. 5) is lit. However, if the pressure has fallen sufficiently low, vent valve 144 is closed at step 409 and then purge valve 126 is opened at step 410. This causes the high pressure area of manifold 32 to fill with purge gas from purge gas cylinder 28 to dilute any process gas remaining in manifold 32.

Setpoint time t2 is the purge time per cycle and purge valve 126 remains open for at least as long as setpoint time t2, as indicated at step 411. Advantageously, purge valve 126 is open for three seconds beyond setpoint time t2, for safety. After this time has elapsed, at step 412 it is detected whether the pressure within the high pressure area is above the setpoint minimum purge pressure, as indicated by pressure indicating transducer 154. If the pressure has remained too low, that is, if a sufficient pressure of purge gas has not filled manifold 32, the purge cycle and purge operation are aborted at step 408 and low pressure indicator 88 (FIG. 5) is lit. However, if the pressure is sufficiently high, program 400 proceeds to step 413, wherein it is determined whether the required number N of purge cycles has been performed. If more purge cycles remain to be performed, control program proceeds to step 403, where the number M of completed purge cycles is incremented and another purge cycle proceeds. When N purge cycles have been detected at step 413, control program 400 ends at step 414.

Control program 400 may be implemented in precisely the same way during step 302 (FIG. 8) for performing the pre-purge operation as during step 304 for performing the post-purge operation.

PROGRAM FOR CHANGING FILTER

Figure 12:
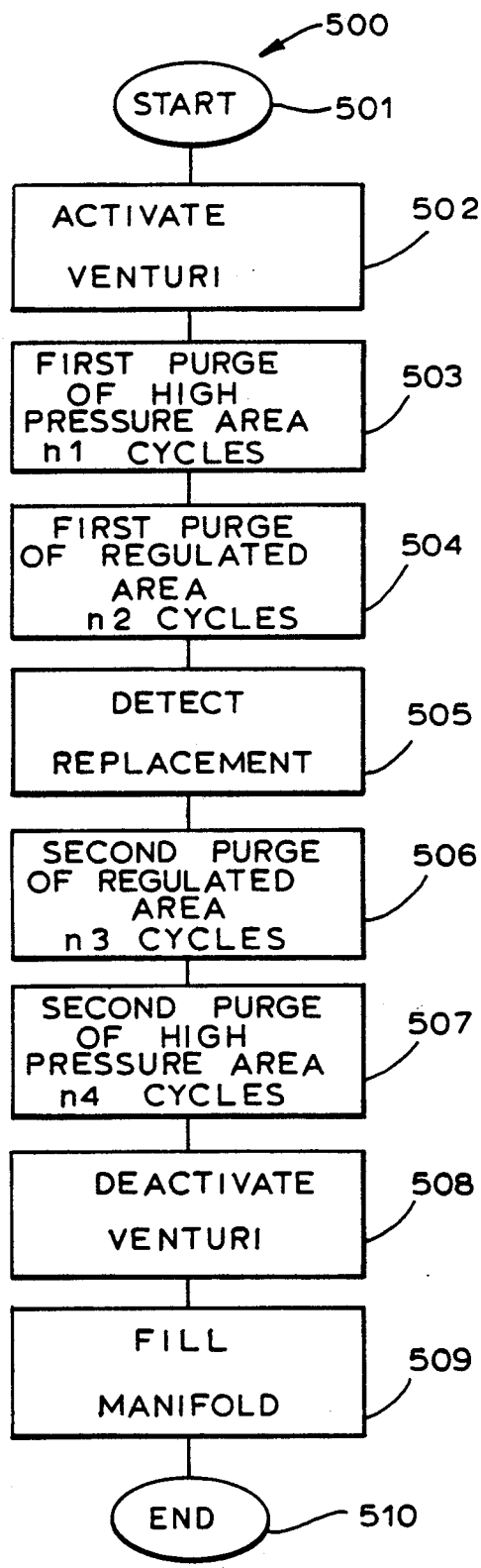
FIG. 12 is a flowchart of a fourth control program operated by the control circuitry of FIG. 6 during a purge-to-change-filter operation.

In accordance with a further aspect of the present invention, an advantageous purge-to-change-filter operation may be performed. This operation is an automatic sequence designed to evacuate manifold 32 of process gas, allow a prompted filter replacement, repurge manifold 32 and refill it with process gas. The control program 500 for this advantageous operation is illustrated in FIG. 12.

In addition to the time setpoints t1 and t2, and the maximum vacuum and minimum purge pressure setpoints, now four cycle number setpoints n1, n2, n3 and n4 are initially selected through operation of front panel 22 or remote terminal 184. Each of these setpoints n1–n4 is a purge cycle number, indicating the number of times a particular type of purge cycle is to be performed during the purge-to-change-filter operation. It is to be noted that in this operation manifold 32 is opened to the atmosphere in order to remove and replace the filters, such as filters 164, 166 and 156 (FIG. 4). All traces of process gas must surely be removed from manifold 32 under these conditions.

Control program 500 begins at step 501 when the operator actuation to begin the purge operation is received. Upon receiving this actuation, at step 502, venturi 146 is activated and remains activated throughout the purge-to-change-filter operation. This continued activation of venturi 146 provides the additional advantage that any process gas which may leak into the atmosphere may still be caught by the vacuum action of venturi 146 and removed.

Figure 13:
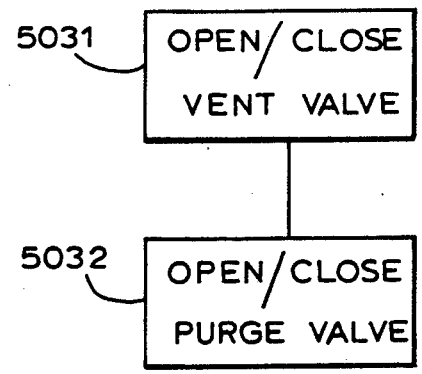
FIG. 13 is a flowchart of a first subroutine of the program of FIG. 12.

At step 503, a first purge of the high pressure area of manifold 32 is performed including n1 purge cycles. As indicated in FIG. 13, the purge of the high pressure area is identical to the purge operation of control program 400, in which vent valve 144 is opened and closed (step 5031), and then purge valve 126 is opened and closed (step 5032). This is effective to successively evacuate the high pressure area and then to fill the high pressure area with purge gas, thereby diluting any process gas which may remain within the high pressure area and providing a higher pressure for improved operation of venturi 146.

Figure 14:
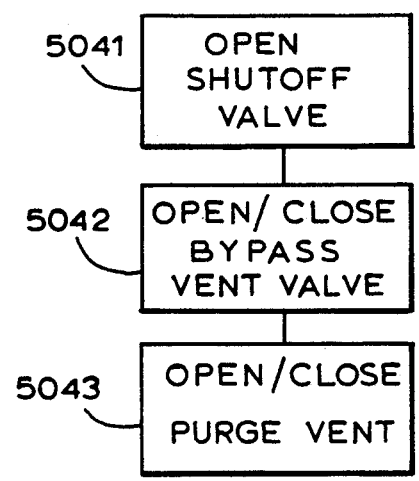
FIG. 14 is a flow chart of a second subroutine of the program of FIG. 12.

In step 504 of control program 500, a first purge of the regulated area is performed, including n2 purge cycles. As indicated in FIG. 14, the purge of the regulated area begins at step 5041 in which high pressure shut-off valve 152 is opened. Thereafter, the purge operation of control program 400 with n2 purge cycles is performed, except that now by-pass vent valve 176 is opened and closed in place of vent valve 144 (step 5042), and then purge valve 126 is opened and closed (step 5043).

When step 504 is complete, alphanumeric display 70 will display the message "Change Filter...Push ENTER when done." The operator can then change any of the filters. Purge valve 126 and high pressure shutoff valve 152 are open so that manifold 32 will not be contaminated upstream of the filter connection. When the operator is finished, he pushes the ENTER pushbutton 116.

At step 505 of control program 500, this actuation indicating the replacement of the appropriate filter is detected. At step 506, a second purge of the regulated area including n3 of the purge cycles illustrated in FIG. 14 are performed. Step 506 is otherwise identical to step 503. In step 507, a second purge of the high pressure area occurs in which n4 purge cycles as illustrated in FIG. 13 are performed. Step 507 is otherwise identical to step 504. Advantageously, however, n1 equals n4 and n2 equals n3, i.e. purge operations of the high pressure area have the same number of purge cycles, and purge operations of the regulated area have the same number of purge cycles.

Thereafter, venturi 146 is deactivated in step 508 and manifold 32 is filled with process gas, advantageously using the method illustrated in FIG. 9.

Although preferred embodiments of the present invention have been described, incorporating a large number of advantageous methods for controlling the functions of the automated gas cabinet and the associated control circuitry and valve operation, it will be apparent to one skilled in the art that many modifications and changes may be made without departing from the scope of the present invention. Therefore the scope of the present invention should be determined from the appended claims.

What is claimed is:

1. A method for controlling functions of an automated gas cabinet adapted to supply process gas under pressure through a high pressure area being normally isolated from remaining points of said manifold, said method comprising a purge operation comprising the steps of:
    initially storing data representing selected first and second time intervals in a control system; and
    actuating said control system to automatically perform at least one automatic purge cycle including the steps of:
    activating venturi means connected to a first point of said manifold outside of said high pressure area for creating a vacuum in all points of said manifold in fluid communication with said first point;
    opening a vent valve for a period of time equal to said first selected time interval to place said high pressure area of said manifold in fluid communication with said venturi means; and
    following closure of said vent valve, opening a purge valve connected between a supply of purge gas and said high pressure area of said manifold for a period of time equal to said second selected time interval for filling said high pressure area with purge gas.

2. Apparatus for controlling functions of an automated gas cabinet adapted to supply process gas through a high pressure area of a manifold to a tool location, said high pressure area being normally isolated from remaining parts of said manifold, said apparatus comprising;
    control circuit means responsive to a purge actuation signal for automatically generating a plurality of time sequentially ordered purge control signals to control the sequencing of at least one purge operation of said apparatus;
    input means for inputting time duration signals representing first and second time intervals;
    memory means for storing said time duration signals;
    first valve means responsive to a first ordered purge control signal for activating venturi means connected to a first point of said manifold outside of said high pressure area for creating a vacuum in all points of said manifold in fluid communication with said first point;
    vent valve means responsive to a second ordered purge control signal for opening for a period of time equal to said first selected time interval to place said high pressure area of said manifold in fluid communication with said first point; and
    purge valve means connected between a supply of purge gas and said high pressure area of said manifold and responsive to a third ordered purge control signal following closure of said vent valve means for opening for a period of time equal to said second selected time interval for filling said high pressure area with purge gas.

3. A method for controlling functions of an automated gas cabinet adapted to supply process gas under pressure through a high pressure area of a manifold to a tool location, said high pressure area being normally isolated from remaining points of said manifold, said method comprising a purge operation comprising steps of:
    initially storing data representing a selected number of purge cycles in a control system; and actuating said control system to automatically perform the selected number of automatic purge cycles, each said purge cycle including the steps of:

activating venturi means connected to a first point of said manifold outside of said high pressure area for creating a vacuum on all points of said manifold in fluid communication with said venturi means;

temporarily opening a vent valve to place said high pressure area of said manifold in fluid communication with said venturi means; and following closure of said vent valve, temporarily opening a purge valve connected between a supply of purge gas and said high pressure area of said manifold for filling said high pressure area with purge gas.

4. A method according to claim 3, wherein said purge operation further comprises the step of initially storing in said control system data representing selected first and second time intervals, and wherein the elapsed time between opening and closing of said vent valve is equal to said first selected time interval, and wherein the elapsed time between opening and closing of said purge valve is equal to said second selected time interval.

5. A method according to claim 3 further comprising the step of detecting the gas pressure in said high pressure area during evacuation by said venturi and during filling with purge gas and stopping the step in process if said pressure remains above a first level during evacuation, and if said pressure remains below a second level during filling.

6. A method according to claim 3, said method comprising a purge-to-change-supply operation comprising the steps of:

replacing a supply of process gas after said selected purge cycles have been performed;

detecting the replacement of said supply; and actuating said control system to automatically perform a second selected number of purge cycles.

7. A method according to claim 6, including the step of filling said high pressure area with process gas by opening a cylinder valve connected between said supply of process gas and said high pressure area and opening and closing said vent valve a plurality of times, and including the step of detecting the pressure of said process gas to detect the process gas supply for a connection leak.

8. A method according to claim 6 wherein said pressure detecting step includes the steps of detecting an initial value of the pressure of said process gas, detecting a later, final value of said pressure, generating an alarm if said final value is less than said initial value by at least a predetermined amount, and closing said cylinder valve.

9. Apparatus for controlling functions of an automated gas cabinet adapted to supply process gas through a high pressure area of a manifold to a tool location, said high pressure area being normally isolated from remaining points of said manifold, said apparatus comprising;

control circuit means responsive to a purge actuation signal for automatically generating a plurality of time sequentially ordered purge control signals to control the sequencing of at least one purge operation including at least one purge cycle of said apparatus;

input means for initially developing data signals representing a selected number of purge cycles;

memory means for storing said data signals representing the selected number of purge cycles; and a plurality of valve means on said manifold responsive to said control circuit means for performing said purge operation including said selected number of purge cycles.

10. Apparatus according to claim 9, wherein said valve means includes first valve means responsive to a first ordered purge control signal for connecting a first point of said manifold outside of said high pressure area to venturi means for creating a vacuum on all points of said manifold in fluid communication with said venturi means, and vent valve means responsive to a second ordered purge control signal for opening to place said high pressure area of said manifold in fluid communication with said venturi means;

means for measuring the gas pressure in said high pressure area;

said control circuit means including means for stopping said purge operation if pressure within said high pressure area remains above a pre-determined maximum vacuum pressure during generation of said second ordered purge control signal;

said valve means further including purge valve means connected between a supply of purge gas and said high pressure area of said manifold and responsive to a third ordered purge control signal from said control circuit means for opening to fill said high pressure area with purge gas;

said control circuit means including means for stopping said purge operation if pressure within said high pressure area remains below a pre-determined minimum purge pressure during generation of said third ordered purge control signal.

11. A method for controlling functions of an automated gas cabinet adapted to supply process gas through a manifold to tool location, said method comprising the steps of:

initially storing in data storage means data indicative of a plurality of selected setpoints in a control system of said gas cabinet, said setpoints being respectively indicative of a selected one of a time interval and a pressure and being adapted for control of a respective function during operation of said gas cabinet; and controlling said function in response to the respective stored setpoints.

12. A method according to claim 11, wherein said step of controlling includes generating an alarm indication when one of said setpoints is violated.

13. A method according to claim 11, further comprising the step of providing a printout of said plurality of selected setpoints at a terminal location remote from said automated gas cabinet.

14. Apparatus for controlling functions of an automated gas cabinet adapted to supply process gas through a manifold to a tool location, said apparatus comprising:

input means for developing input data signals indicative of a selected plurality of setpoints, said setpoints being respectively indicative of a selected one of a time interval and a pressure and being adapted for control of a respective function during operation of said gas cabinet;

memory means for storing said signals, and control circuit means responsive to the stored data signals for controlling said functions of said gas cabinet.

15. Apparatus according to claim 14, further comprising remote terminal means controllable by said control circuit means for providing a printout of the selected setpoints.

16. Apparatus for controlling functions of an automated gas cabinet adapted to supply process gas through a manifold to a tool location, said apparatus comprising:

- control circuit means for controlling the operation of a plurality of valve means connected to respective points of said manifold for placing the respective points of said manifold in fluid communication with other selected points of said manifold;
- input means for developing input data signals indicative of a plurality of selected setpoints, said setpoints being respectively indicative of a selected one of a time interval and a pressure and being adapted for control of a respective function during operation of said gas cabinet; and
- memory means for storing said data signals;
- said control circuit means controlling the opening and closing of respective ones of said valve means in response to respective data signals representing setpoints indicative of respective time intervals and in response to respective data signals representing setpoints indicative of respective pressures.

17. An automatic purge-to-change-filter method for an automated gas cabinet adapted to supply process gas successively through a high pressure area and a regulated area of a manifold to a tool location, said regulated area having replaceable filter means for filtering said process gas removably connected thereto, said method comprising the steps of:

- actuating a control system of said gas cabinet to perform the following steps automatically;
- activating venturi means connected to a first point of said manifold outside of said high pressure area and said regulated area for creating a vacuum on all points of said manifold in fluid communication with said first point;
- performing a first purge operation of said high pressure area including at least one first purge cycle by placing the high pressure area in fluid communication with said first point;
- performing a first purge operation of said regulated area including at least one second purge cycle by placing the regulated area in fluid communication with said first point;
- detecting the replacement of a previously connected filter means with a newly connected filter means;
- performing a second purge operation of said regulated area including at least one said second purge cycle by placing the regulated area in fluid communication with said first point;
- performing a second purge operation of said high pressure area including at least one said first purge cycle by placing the high pressure area in fluid communication with said first point; and
- deactivating said venturi means.

18. A method according to claim 17, further comprising a final step of filling said manifold with process gas.

19. A method according to claim 17, wherein each first purge cycle of each of said first and second purge operations of said high pressure area includes the steps of:

- opening and closing a vent valve connected between said high pressure area and said venturi means; and
- opening and closing a purge valve connected between said high pressure area and a supply of purge gas.

20. A method according to claim 17, further comprising the initial step of storing data representing first, second, third and fourth selected numbers of purge cycles in a memory of said control system;

- wherein said step of performing said first purge operation of said high pressure area includes the step of performing the first selected number of first purge cycles, each of said first purge cycles including the step of opening and closing a vent valve connected between said venturi means and said high pressure of said manifold to place said high pressure area in fluid communication with said venturi means and the step of opening and closing a purge valve connected between a supply of purge gas and said high pressure area of said manifold for filling said high pressure area with said purge gas;
- wherein said step of performing said first purge operation of said regulated area includes the step of performing the second selected number of second purge cycles, each of said second purge cycles including the steps of placing said regulated area in fluid communication with said high pressure area, opening and closing a by-pass vent valve connected between said regulated area and said first point to place said regulated area in fluid communication with said first point, and opening said purge valve to fill said regulated area with said purge gas;
- wherein said second purge operation of said regulated area includes the third selected number of said second purge cycles; and
- wherein said second purge operation of said high pressure area includes the fourth selected number of said first purge cycles.

21. A method according to claim 20, wherein said first selected number is equal to said fourth selected number and wherein said second selected number is equal to said third selected number.

22. Apparatus for facilitating the replacement of a component in a semiconductor process gas supply system, said system comprising main conduit means for conducting said gas to a utilization location, connecting conduit means for connecting said component to said main conduit means, purging means for purging said connecting conduit means to facilitate removal of said component and replacement by another, said purging means comprising means for flowing a purge gas into said connecting conduit means and displacing gas contained therein, control means for controlling the time during which said purge gas flows, said control means including data storage and retrieval means, and input means for varying, setting and storing data determining said time.

23. Apparatus as in claim 22, in which said component is a process gas container.

24. Apparatus as in claim 22, in which said component comprises filter means, in which said purging means is adapted to purge said filter means as well as said connecting conduit means.

25. Apparatus as in claim 22, in which said purging means is adapted to perform purging in a plurality of repetitive cycles, said purging means including evacuation means for evacuating said connecting conduit means during a first portion of one of said cycles, purge gas supply means for supplying purge gas to said connecting conduit means during a second portion of said cycle at a pressure higher than the pressure in said connecting conduit means after its evacuation, and means for repeating said cycle a predetermined number of times.

26. Apparatus as in claim 25, in which said input means is adapted to vary, set and store data representing the time duration of purge gas flow in each of the cycles, and the number of said cycles.

27. Apparatus as in claim 22, including means for detecting and signalling the replacement of said component, for repeating the operation of said purging means, and for filling said connecting conduit means with process gas.

28. Apparatus as in claim 24, including by-pass means selectively operable to connect the output of said filter means to an evacuation source, purge gas supply means for supplying purge gas to the evacuated connecting conduit means, said control means being adapted to operate said by-pass means and said purge gas supply means alternatingly in a plurality of cycles, with the time duration of each portion of each cycle and the number of cycles being selectable by operation of said input means.

29. A method for facilitating the replacement of components in a semiconductor process gas supply system having a conduit for conducting process gas to a utilization station, said method comprising the steps of:
    purging said conduit, prior to removing a component from said system, by flowing a purge gas through said conduit for a predetermined length of time;
    selecting said length f time by utilizing adjustable input means for inputting to and storing in pre-programmed general purpose digital computer means signals representing said predetermined length of time, and
    utilizing said computer means to automatically control said purging step in accordance with said stored signals.

30. A method as in claim 29 in which said purging process comprises a plurality of cycles each comprising evacuation of a portion of said conduit adjacent said component followed by filling said portion with purge gas, said signals representing the time duration of at least the purge gas flow of each of said cycles, and the number of said cycles.

31. A method as in claim 30, in which the time duration of each of said cycles is comprised of the time for evacuation of said conduit portion and the time for filling said portion with purge gas, said signals including separate signals representing each of the last-named times.

32. A method as in claim 29, in which said system includes a plurality of process gas supply cabinets, said cabinets each supplying process gas through its conduit means to at least one utilization location, a computer connected to each cabinet for use as a master controller for controlling and monitoring the operation of each of said cabinets, the step of selecting said length of time being performed by inputting signals for each of said cabinets separately by use of said master controller.

33. A method as in claim 32, in which said master controller is adapted to set, store and print out setpoints for the operation of said cabinets.

* * * * *